(12) United States Patent
Liao et al.

(10) Patent No.: US 8,999,830 B2
(45) Date of Patent: Apr. 7, 2015

(54) SEMICONDUCTOR DEVICE HAVING METAL GATE AND MANUFACTURING METHOD THEREOF

(71) Applicant: United Microelectronics Corp., Hsin-Chu (TW)

(72) Inventors: Po-Jui Liao, Taichung (TW);
Tsung-Lung Tsai, Tai-Nan (TW);
Chien-Ting Lin, Hsinchu (TW);
Shao-Hua Hsu, Taoyuan County (TW);
Yeng-Peng Wang, Kaohsiung (TW);
Chun-Hsien Lin, Tainan (TW);
Chan-Lon Yang, Taipei (TW);
Guang-Yaw Hwang, Tainan (TW);
Shin-Chi Chen, Tainan (TW);
Hung-Ling Shih, Chiayi County (TW);
Jiunn-Hsiung Liao, Tainan (TW);
Chia-Wen Liang, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/135,520

(22) Filed: Dec. 19, 2013

(65) Prior Publication Data
US 2014/0127892 A1 May 8, 2014

Related U.S. Application Data

(62) Division of application No. 13/158,479, filed on Jun. 13, 2011, now Pat. No. 8,704,294.

(51) Int. Cl.
*H01L 21/3205* (2006.01)
*H01L 29/78* (2006.01)
*H01L 29/66* (2006.01)
*H01L 21/8238* (2006.01)

(52) U.S. Cl.
CPC .......... *H01L 29/78* (2013.01); *H01L 29/66545* (2013.01); *H01L 21/823842* (2013.01); *H01L 21/82385* (2013.01)

(58) Field of Classification Search
None
See application file for complete search history.

(56) References Cited

U.S. PATENT DOCUMENTS

| | | | |
|---|---|---|---|
| 6,033,963 A | 3/2000 | Huang et al. |
| 6,613,621 B2 | 9/2003 | Uh |
| 6,653,698 B2 | 11/2003 | Lee et al. |
| 6,858,483 B2 | 2/2005 | Doczy et al. |
| 6,921,711 B2 | 7/2005 | Cabral, Jr. et al. |
| 6,953,719 B2 | 10/2005 | Doczy et al. |
| 6,967,131 B2 | 11/2005 | Saenger et al. |
| 6,972,225 B2 | 12/2005 | Doczy et al. |
| 7,029,966 B2 | 4/2006 | Amos et al. |
| 7,056,794 B2 | 6/2006 | Ku |

(Continued)

*Primary Examiner* — Reema Patel
(74) *Attorney, Agent, or Firm* — Winston Hsu; Scott Margo

(57) ABSTRACT

A method of manufacturing a semiconductor device having metal gate includes providing a substrate having a first transistor and a second transistor formed thereon, the first transistor having a first gate trench formed therein, forming a first work function metal layer in the first gate trench, forming a sacrificial masking layer in the first gate trench, removing a portion of the sacrificial masking layer to expose a portion of the first work function metal layer, removing the exposed first work function metal layer to form a U-shaped work function metal layer in the first gate trench, and removing the sacrificial masking layer. The first transistor includes a first conductivity type and the second transistor includes a second conductivity type. The first conductivity type and the second conductivity type are complementary.

27 Claims, 17 Drawing Sheets

(56) References Cited

U.S. PATENT DOCUMENTS

| | | |
|---|---|---|
| 7,064,050 B2 | 6/2006 | Cabral, Jr. et al. |
| 7,064,066 B1 | 6/2006 | Metz et al. |
| 7,074,680 B2 | 7/2006 | Doczy |
| 7,112,851 B2 | 9/2006 | Saenger et al. |
| 7,118,251 B1 | 10/2006 | Chambers et al. |
| 7,126,199 B2 | 10/2006 | Doczy et al. |
| 7,148,548 B2 | 12/2006 | Doczy et al. |
| 7,153,734 B2 | 12/2006 | Brask |
| 7,153,784 B2 | 12/2006 | Brask et al. |
| 7,157,378 B2 * | 1/2007 | Brask et al. ............ 438/704 |
| 7,183,184 B2 | 2/2007 | Doczy et al. |
| 7,220,635 B2 | 5/2007 | Brask et al. |
| 7,316,949 B2 | 1/2008 | Doczy et al. |
| 7,317,231 B2 | 1/2008 | Metz et al. |
| 7,326,610 B2 | 2/2008 | Amos et al. |
| 7,355,281 B2 | 4/2008 | Brask et al. |
| 7,381,608 B2 * | 6/2008 | Brask et al. ............ 438/216 |
| 7,390,709 B2 | 6/2008 | Doczy et al. |
| 8,310,012 B2 | 11/2012 | Hwang |
| 2007/0262451 A1 | 11/2007 | Rachmady et al. |
| 2009/0039433 A1 | 2/2009 | Yang et al. |
| 2009/0057769 A1 | 3/2009 | Wei |
| 2009/0186458 A1 | 7/2009 | Yu |
| 2009/0315096 A1 * | 12/2009 | Wei et al. ............ 257/315 |
| 2010/0052066 A1 | 3/2010 | Yu et al. |
| 2010/0065926 A1 | 3/2010 | Yeh et al. |
| 2010/0068877 A1 | 3/2010 | Yeh et al. |
| 2011/0057267 A1 * | 3/2011 | Chuang et al. ............ 257/380 |
| 2011/0104880 A1 | 5/2011 | Heinrich |
| 2011/0248359 A1 * | 10/2011 | Hwang et al. ............ 257/410 |
| 2012/0068261 A1 | 3/2012 | Kwon |
| 2012/0313178 A1 | 12/2012 | Liao |

* cited by examiner

SEMICONDUCTOR DEVICE HAVING METAL GATE AND MANUFACTURING METHOD THEREOF

CROSS REFERENCE TO RELATED APPLICATIONS

This application is a division of U.S. application Ser. No. 13/158,479 filed on Jun. 13, 2011, and incorporated herein by reference in its entirety.

BACKGROUND OF THE INVENTION

1. Field of the Invention

The invention relates to a semiconductor device having a metal gate and manufacturing method thereof, and more particularly, to a semiconductor device having a metal gate and manufacturing method applied with a gate last process.

2. Description of the Prior Art

With a trend toward scaling down the size of the semiconductor device, work function metals are used to replace the conventional polysilicon gate to be the control electrode that competent to the high-K gate dielectric layer. The conventional dual metal gate methods are categorized into gate first process and gate last process. Among the two main processes, the gate last process is able to avoid processes of high thermal budget and to provide wider material choices for the high-K gate dielectric layer and the metal gate, and thus gradually replaces the gate first process.

Please refer to FIG. 1, which is a schematic drawing illustrating a conventional semiconductor device having a metal gate fabricated by the gate last process. In the conventional gate last process, a dummy gate or a replacement gate is formed on a substrate 100 and followed by steps of forming a conventional metal-oxide semiconductor (MOS) transistor device 110 and forming an inter-layer dielectric (ILD) layer 120. Subsequently, the dummy/replacement gate is removed to form a gate trench. Then the gate trench is filled with work function metals required by different conductivity type. However, layer 130 such as barrier layer or strained stress layer is often formed in the gate trench before forming the metals. And each layer 130 reduces an opening width of the gate trench by forming overhangs as depicted by circle A in FIG. 1. The overhang problem makes it difficult to fill the gate trench with the work function metal layer 140. Serious overhang problem such as overhang merging or the metals layer 140 merging even results in a seam 160 in the gate trench and makes the filling metal layer 150 cannot be formed in the gate trench as desired. Eventually, the electrical performance of the transistor device 110 having the metal gate is deteriorated.

SUMMARY OF THE INVENTION

According to a first aspect of the present invention, there is provided a method of manufacturing a semiconductor device having metal gate. The method includes providing a substrate having a first transistor and a second transistor formed thereon, the first transistor having a first gate trench; forming a first work function metal layer in the first gate trench; forming a sacrificial masking layer in the first gate trench; removing a portion of the sacrificial masking layer to expose a portion of the first work function metal layer; removing the exposed first work function metal layer to form a U-shaped work function metal layer; and removing the sacrificial masking layer. The first transistor further includes a first conductivity type and the second transistor further includes a second conductivity type, and the first conductivity type and the second conductivity type are complementary.

According to a second aspect of the present invention, there is provided a method of manufacturing a semiconductor device having metal gate. The method includes providing a substrate having a first transistor and a second transistor formed thereon, the first transistor having a first gate trench formed therein, the second transistor having a second gate trench formed therein, and an opening width of the second gate trench is larger than an opening width of the first gate trench; forming a first work function metal layer in the first gate trench; forming a sacrificial masking layer in the first gate trench and the second gate trench; forming a patterned photoresist covering the second transistor and exposing the sacrificial masking layer in the first gate trench on the substrate; removing a portion of the sacrificial masking layer to expose a portion of the first work function metal layer; and removing the exposed first work function metal layer to form a U-shaped work function metal layer in the first gate trench.

According to a third aspect of the present invention, there is provided a semiconductor device having a metal gate. The semiconductor device includes a substrate having a first gate trench and second gate trench formed thereon, a gate dielectric layer respectively formed in the first gate trench and the second gate trench, a first work function metal layer formed on the gate dielectric layer in the first gate trench, a second work function metal layer respectively formed in the first gate trench and the second gate trench, and a filling metal layer formed on the first work function metal layer and the second work function metal layer. The second work function metal layer formed in the first gate trench includes an inverted Ω shape.

According to the method of manufacturing a semiconductor device having metal gate provided by the present invention, the sacrificial masking layer not filling the first gate trench is formed to protect a portion of the first work function metal layer in the first gate trench. Therefore the unnecessary first work function metal layer on the substrate and the overhang at the opening of the first gate trench are removed. Consequently, layers such as the second work function metal layer and the filling metal layer are successfully formed in the first gate trench without any seam. Therefore the semiconductor device having metal gate provided by the present invention has the advantage of improved reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2A-8 are schematic drawings illustrating a method of manufacturing a semiconductor device having metal gate provided by a first preferred embodiment of the present invention; wherein FIG. 2A is a drawing illustrating the method provided by the first preferred embodiment;

FIGS. 3-8 are schematic drawings illustrating steps subsequent to FIG. 2A.

DETAILED DESCRIPTION

Figure 1:
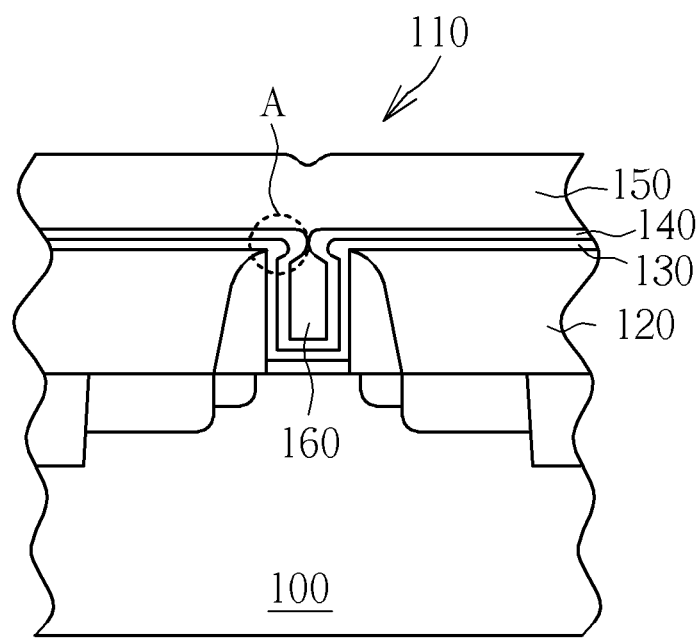
FIG. 1 is a schematic drawing illustrating a conventional semiconductor device having a metal gate fabricated by the gate last process.
Figure 2A:
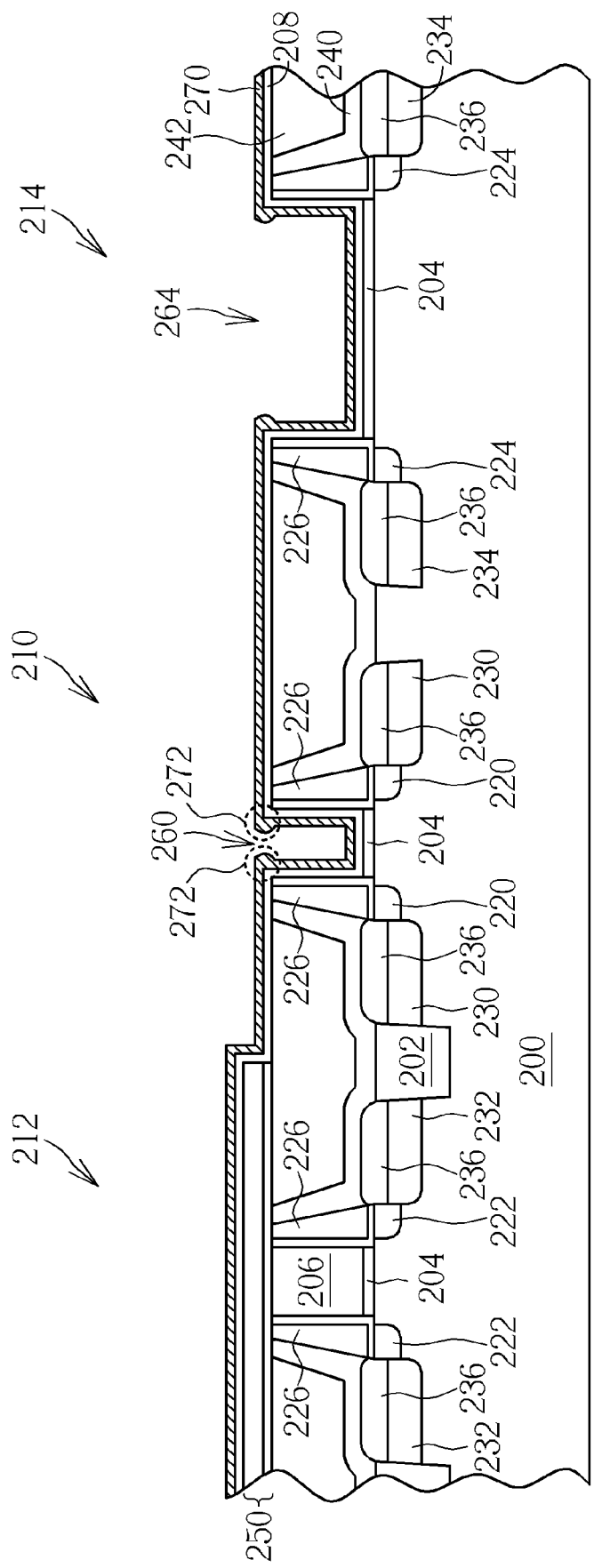

Please refer to FIGS. 2A-8, which are schematic drawings illustrating a method of manufacturing a semiconductor device having metal gate provided by a first preferred embodiment of the present invention. As shown in FIG. 2A, the preferred embodiment first provides a substrate 200 such as a silicon substrate, a silicon-containing substrate, or a silicon-on-insulator (SOI) substrate. A plurality of shallow trench isolation (STI) 202 is formed in the substrate 200 for providing electrical isolation. A first transistor 210, a second transistor 212, and a third transistor 214 are formed on the substrate 200. The first transistor 210 and the third transistor 214 include a first conductivity type, the second transistor 212 includes a second conductivity type, and the first conductivity type and the second conductivity type are complementary. The first transistor 210 and the second transistor 212 having the complementary conductivity types are electrically isolated from each other by the STI 202. Although the first transistor 210 and the third transistor 214 include the same conductivity type, the first transistor 210 and the third transistor 214 include different line widths. For example, the first transistor 210 is the transistor device with line width smaller than 40 nanometer (nm) such as the logic circuit device while the third transistor 214 is the transistor device with line width larger than 0.15 micrometer (μm) such as the static random access memory (SRAM) device. In the preferred embodiment, the first conductivity type is the p-type and the second conductivity type is the n-type. However, those skilled in the art would easily realize that it is not limited to have the first conductivity type being the n-type and the second conductivity type is the p-type.

Please refer to FIG. 2A. The first transistor 210, the second transistor 212, and the third transistor 214 respectively include a gate dielectric layer 204 and a dummy gate layer 206 such as a polysilicon layer. The gate dielectric layer 204 can be a conventional silicon oxide (SiO) layer or a high-K gate dielectric layer. The first transistor 210, the second transistor 212, and the third transistor 214 respectively include a first light doped drain (LDD) 220, a second LDD 222 and a third LDD 224, a spacer 226, and a first source/drain 230, a second source/drain 232 and a third source/drain 234. Salicides 236 are formed on the first source/drain 230, the second source/drain 232 and the third source/drain 234. After forming the first transistor 210, the second transistor 212 and the third transistor 214, a contact etch stop layer (CESL) 240 and an inter-layer dielectric (ILD) layer 242 are sequentially formed on the substrate 200. Additionally, selective epitaxial growth (SEG) method can be utilized to form the sources/drains 230/232/234 in the preferred embodiment. Since the steps and material choices for the abovementioned elements are well-known to those skilled in the art, those details are omitted herein in the interest of brevity.

Please still refer to FIG. 2A. After forming the CESL 240 and the ILD layer 242, a planarization process is performed to remove a portion of the CESL 240 and the ILD layer 242 to expose the dummy gates 206 of the first transistor 210, the second transistor 212 and the third transistor 214. Thereafter, a patterned hard mask 250 is formed on the substrate 200. The patterned hard mask 250 preferably is a multi layer formed to cover the second transistor 212. After forming the patterned hard mask 250, a proper etching process is performed to remove the dummy gates of the first transistor 210 and the third transistor 214 to respectively form a first gate trench 260 in the first transistor 210 and a third gate trench 264 in the third transistor 214. During forming the first gate trench 260 and the third gate trench 264, the patterned hard mask 250 renders protection to the second transistor 212. Because the opening width of the gate trench is equal to the line width of the dummy gate 206, an opening width of the third gate trench 264 is larger than an opening width of the first gate trench 260 as shown in FIG. 2A. After the etching process, the gate dielectric layer 204 is exposed in bottoms of the first gate trench 260 and the third gate trench 264. It is noteworthy that a high-K first process can be integrated into the method provided by the preferred embodiment. Accordingly, the gate dielectric layer 204 includes a high-K gate dielectric layer, and the high-k gate dielectric layer is selected from the group consisting of silicon nitride (SiN), silicon oxynitride (SiON) and metal oxide. And the metal oxide comprises hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), or hafnium zirconium oxide ($HfZrO_4$).

According to a modification to the preferred embodiment, a patterned photoresist (not shown) is formed on the substrate 200 after exposing the dummy gate 206 of the first transistor 210, the second transistor 212, and the third transistor 214 by the planarization. The patterned photoresist covers the second transistor 212 and exposes the first transistor 210 and the third transistor 214. During removing the dummy gate 206 of the first transistor 210 and the third transistor 214, the patterned photoresist severs as an etching mask for protecting the dummy gate 206 of the second transistor 212.

Figure 2B:
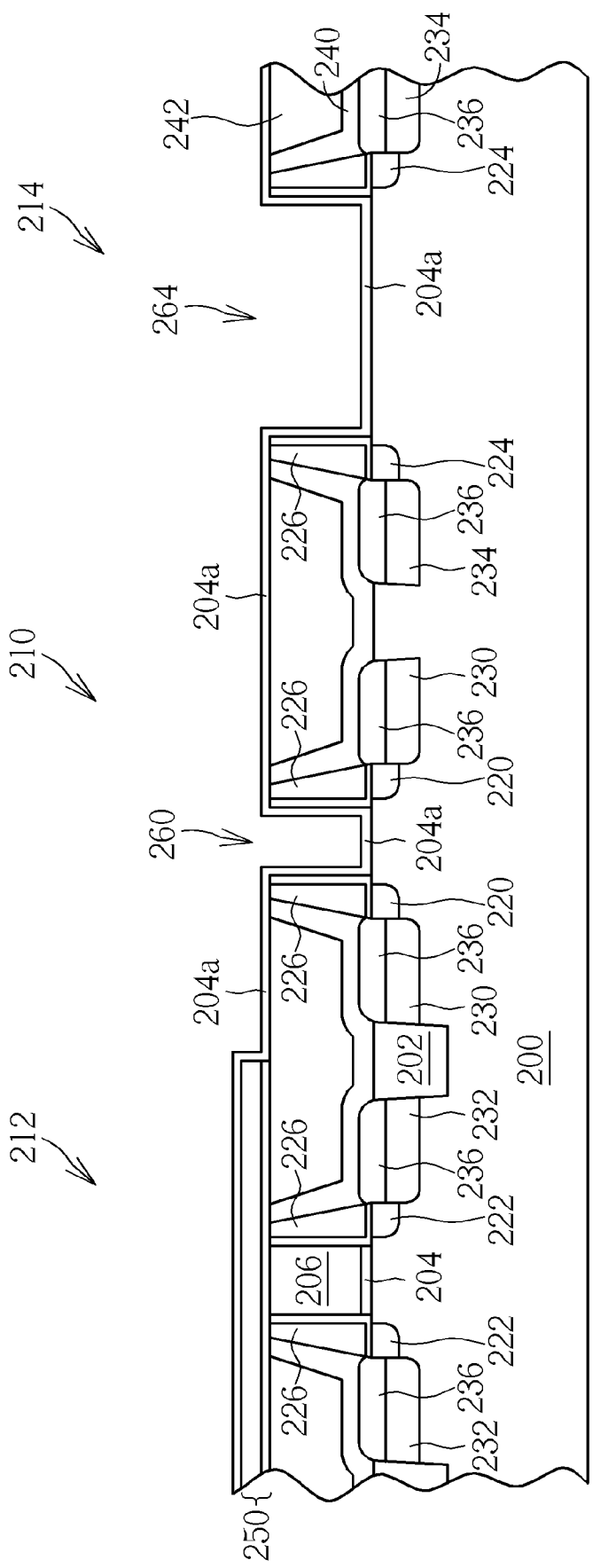
FIG. 2B is a drawing illustrating a modification to the first preferred embodiment.

Please refer to FIG. 2B, which is a drawing illustrating another modification to the first preferred embodiment. As shown in FIG. 2B, a high-K last process can be integrated into the preferred embodiment. In this approach, the gate dielectric layer 204 is a conventional SiO layer and is removed from the first gate trench 260 and the third gate trench 264 after forming the first gate trench 260 and the third gate trench 264. Then, a high-K gate dielectric layer 204a including materials as mentioned above is formed in the first gate trench 260 and the third gate trench 264. As shown in FIG. 2B, the high-K gate dielectric layer 204a formed in the first gate trench 260 and the third gate trench 264 includes an U shape and covers sidewalls and bottoms of the first gate trench 260 and the third gate trench 264.

Additionally, as shown in FIG. 2A, after forming the first gate trench 260 and the third gate trench 264, or after forming the high-K gate dielectric layer 204a, an inter layer 208 is selectively formed in the first gate trench 260 and the third gate trench 264 if required. The inter layer 208 includes a barrier layer, a strained stress layer, a tuning metal layer, or the combination thereof, but not limited to this.

Please refer to FIG. 2A again. Then, a first work function metal layer 270 is formed in the first gate trench 260 and the third gate trench 264. It is noteworthy that an overhang as depicted in Circle 272 is always formed at the openings of the first gate trench 260 when forming the first work function metal layer 270. It is conspicuous that the opening width of the first gate trench 260 is smaller; therefore the overhang 272 generates more serious impact to the opening width of the first gate trench 260. As shown in FIG. 2A, the overhang 272 of first work function metal layer 270 reduces the opening width of the first gate trench 260. The first work function metal layer 270 serves as work function metal for p-type transistor and includes titanium nitride (TiN), titanium carbide (TiC), tantalum nitride (TaN), tantalum carbide (TaC), tungsten carbide (WC), or aluminum titanium nitride (TiAlN). However, those skilled in the art would easily realize that the first work function metal layer 270 is not limited to the abovementioned metals, it can include materials having a work function between about 4.8 eV and about 5.2 eV. And the first work function metal layer 270 can be a single-layered or multi-layered structure.

Figure 3:
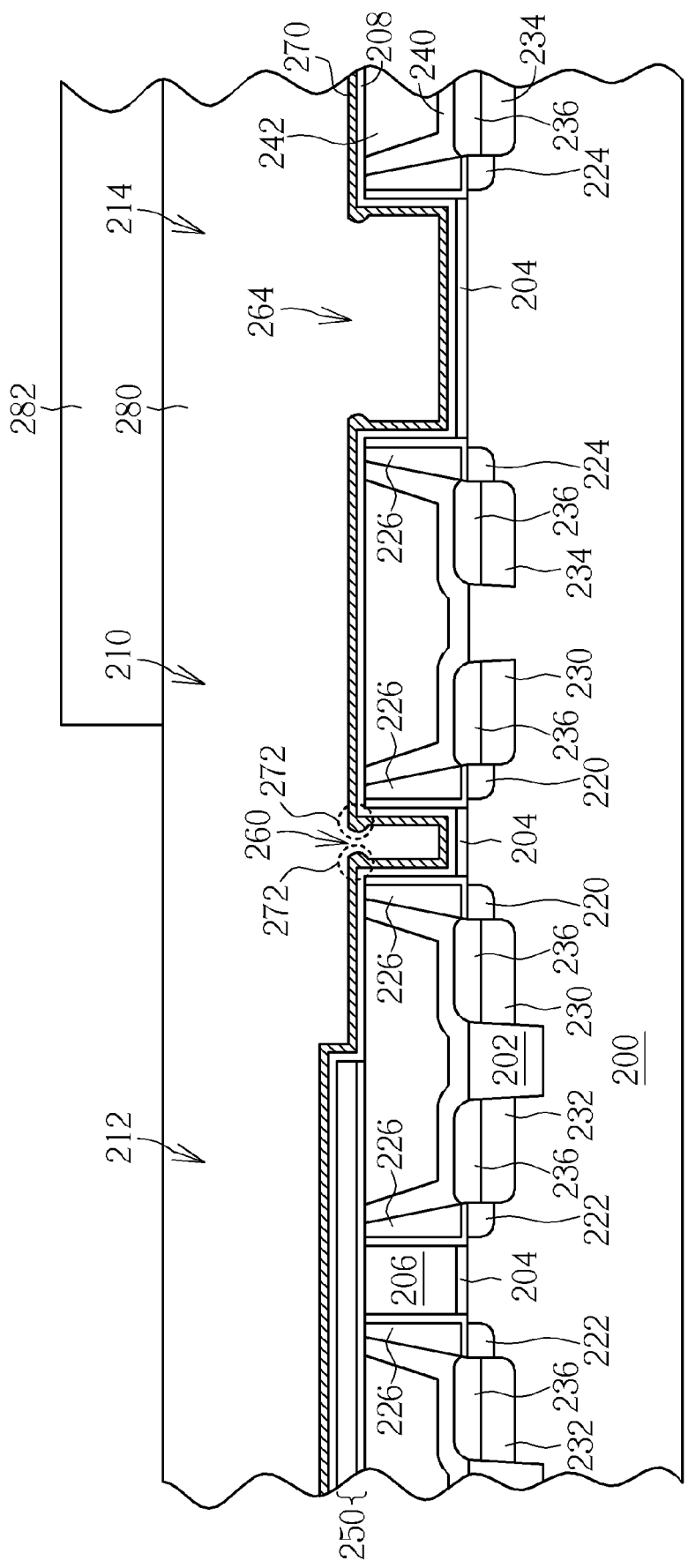

Please refer to FIG. 3. After forming the first work function metal layer 270, a sacrificial masking layer 280 is formed on the substrate 200. The sacrificial masking layer 280 is a layer have superior gap-filling characteristic such as a bottom anti-reflective coating (BARC) layer, a polysilicon layer, a Si-rich layer with silicon dangling bond (SHB) lower than 43%, a spin-on glass (SOG) layer, a sacrificial light absorbing material (SLAM) layer, or an oxide-rich layer such as DUO™ (manufacturing by Honeywell Electronic Materials), but not limited to this. Though the sacrificial masking layer 280 is a single-layered structure as shown in FIG. 3, the sacrificial masking layer 280 can be a multi-layered structure. As shown in FIG. 3, the sacrificial masking layer 280 is also formed in the first gate trench 260 and the third gate trench 264. After forming the sacrificial masking layer 280, a patterned photoresist 282 is formed on the substrate 200. The patterned photoresist 282 covers at least the third transistor 214 but exposes the first transistor 210 and the second transistor 212.

Figure 4:
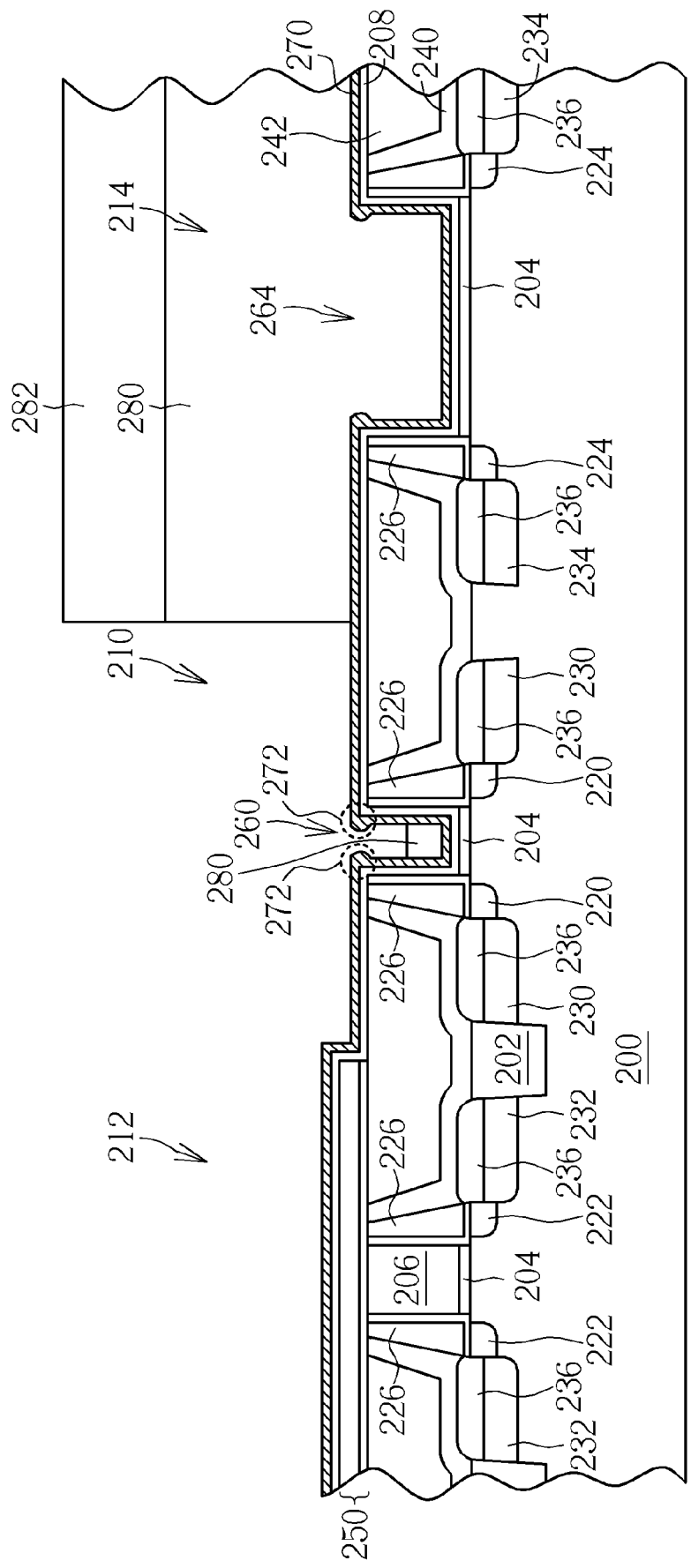

Please refer to FIG. 4. Next, an etching back process is performed to remove a portion of the sacrificial masking layer 280 in the first gate trench 260 and on the substrate 200 with a proper etchant such as CO or $O_2$ plasma. After the etching back process, a surface of the sacrificial masking layer 280 is lower than the opening of the first gate trench 260, that is, lower than a surface of the ILD layer 242. Thus, a portion of the first work function metal layer 270 on the substrate 200 and in the first gate trench 260 is exposed. During the etching back process, the sacrificial masking layer 280 in the third gate trench 264 is protected by the patterned photoresist 282, therefore it remains impervious to the etchant. Because the opening width of the third gate trench 264 is larger than the opening width of the first gate trench 260, the patterned photoresist 282 is formed to protect the sacrificial masking layer 280 in the third gate trench 264 from micro loading effect, which causes over etching to the sacrificial masking layer 280 in the third gate trench 264, and even damages the first work function metal layer 270 under the sacrificial masking layer 280.

Figure 5:
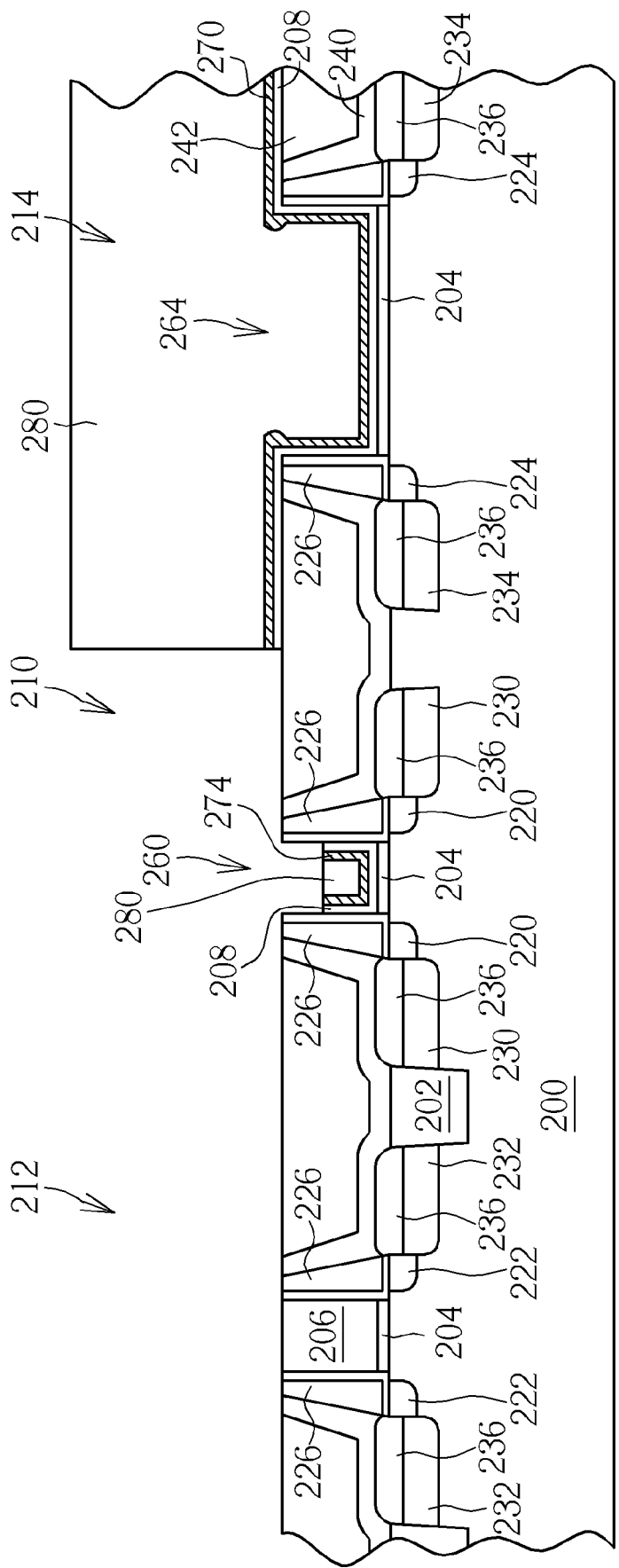

Please refer to FIG. 5. Then, another etching back process is performed to remove the first work function metal layer 270 and the inter layer 208 not covered by the sacrificial masking layer 280 with proper etchant such as ammonium peroxide mixture (APM). In other words, the etching back process removes the first work function metal layer 270 and the inter layer 208 exposed on the substrate 200 and in the first gate trench 260 to not filling the first trench 260. The etching back process simultaneously removes the patterned hard mask 250 on the second transistor 212. More important, the etching back process simultaneously removes the overhang 272 formed at the opening of the first gate trench 260. Thus the opening width of the first gate trench previously reduced by the overhang 272 is widened to an original opening width.

After the etching back process, an U-shaped work function metal layer 274 that is covered and protected by the sacrificial masking layer 280 is formed in the first gate trench 260, and the dummy gate 206 of the second transistor 212 is exposed.

Figure 6:
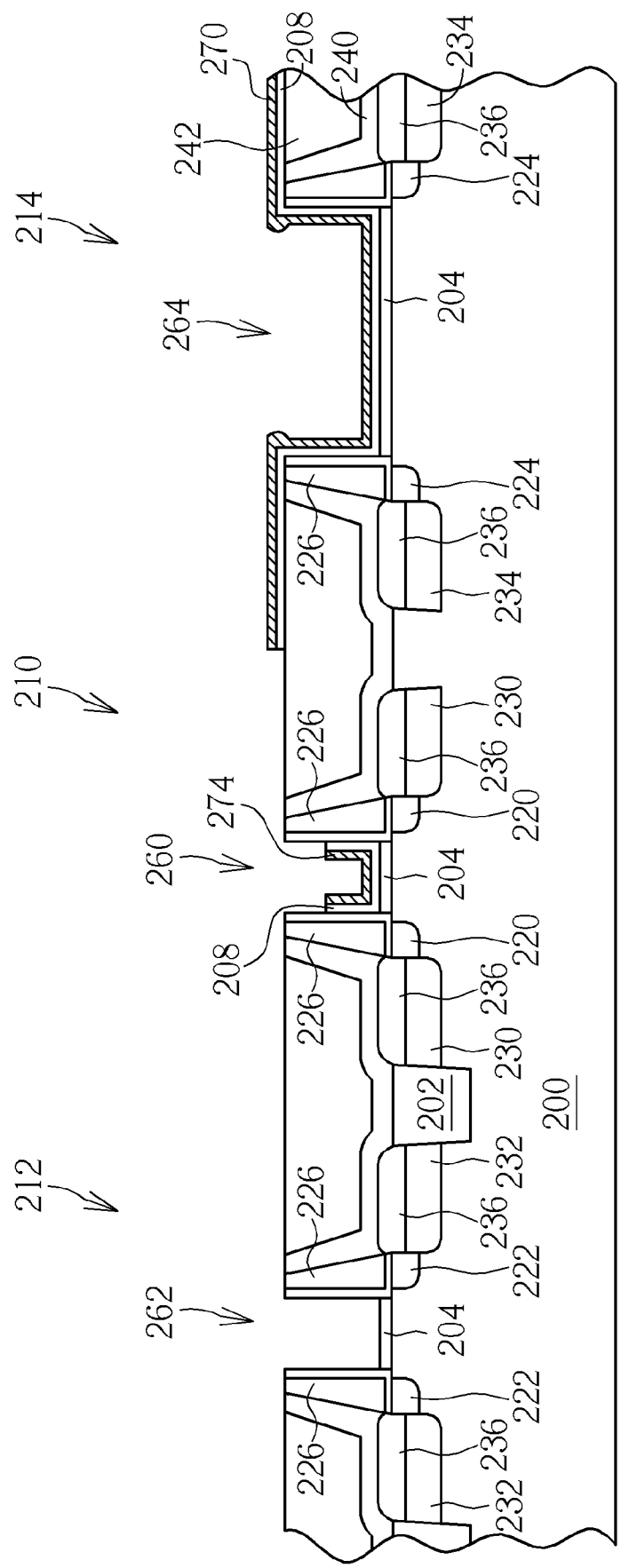

Please refer to FIG. 6. Then, a proper etchant, such as etchant includes $O_2$, $H_2$, and N, is used to remove the sacrificial masking layer 280. An oxygen concentration of the abovementioned etchant is lower than 10%, thus the first work function metal layer 270 is prevented from oxidation and the semiconductor device is prevented from deterioration during removing the sacrificial masking layer 280. In addition, different etchants can be used to remove the sacrificial masking layer 280 depending on the materials used to form the sacrificial masking layer 280. For example, when the sacrificial masking layer 280 includes Si-rich material, tetramethylammonium hydroxide (TMAH) solution with concentration lower than 2.5% is used. It is noteworthy that the etching back process used to etch back the sacrificial masking layer 280, the etching back process used to remove the overhang 272, the patterned hard mask 250 and the portion of the first work function metal layer 270, and the removal of the sacrificial masking layer 280 can be in-situ performed. After removing the sacrificial masking layer 280, another proper etching process is performed to remove the dummy gate 206 of the second transistor 212 to form a second gate trench 262 in the second transistor 212 as shown in FIG. 6. It is noteworthy that an opening width of the second gate trench 262 is the same with the opening width of the first gate trench 260. After the etching process used to form the second gate trench 262, the gate dielectric layer 204 is exposed in a bottom of the second gate trench 262. As mentioned above, when the gate-first process is integrated into the preferred embodiment, the gate dielectric layer 204 includes a high-K gate dielectric layer; when the gate-last process is integrated into the preferred embodiment, the gate dielectric layer can be a conventional SiO layer, and it is removed after forming the second gate trench 262. Subsequently, a high-K gate dielectric layer 204 having an U shape in the second gate trench 262 is formed. The high-K gate dielectric layer can be chosen from the material mentioned afore, therefore those details are omitted for simplicity.

Figure 7:
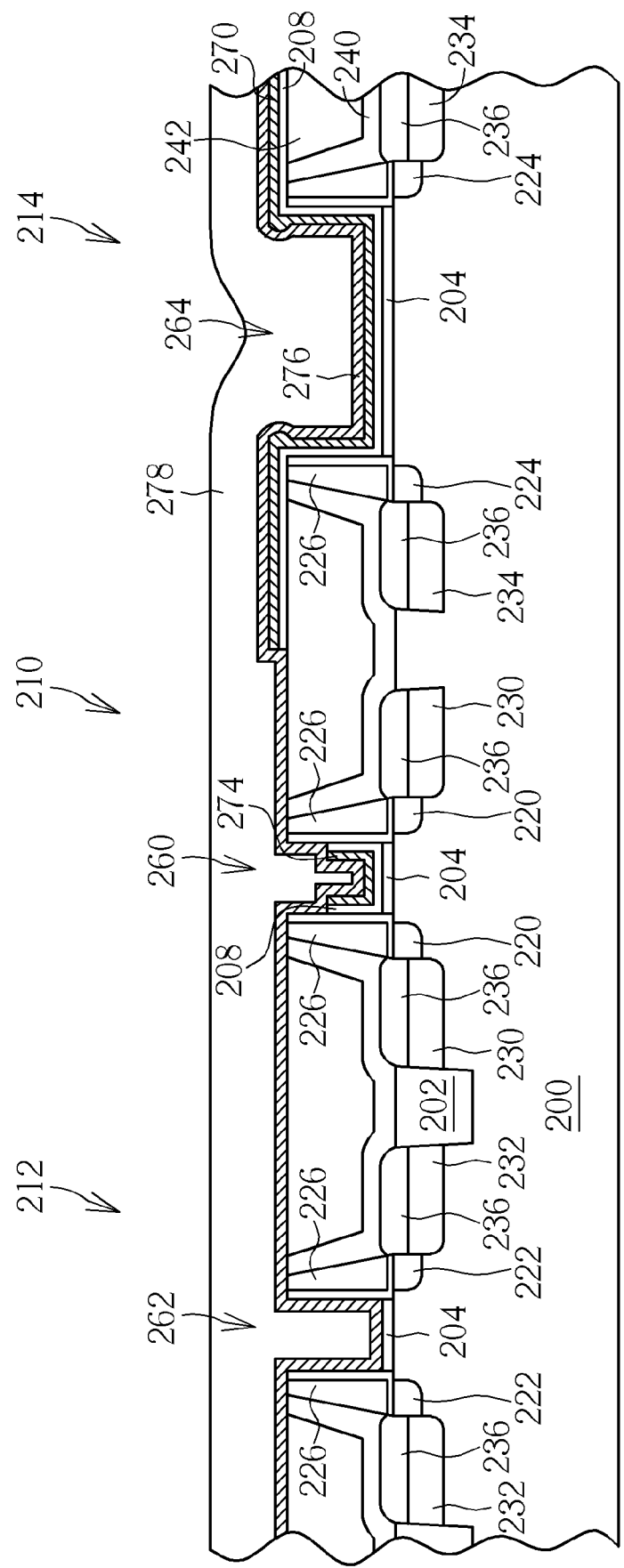

Please refer to FIG. 7. In addition, after forming the second gate trench 262 or after forming the high-K gate dielectric layer, an inter layer (not shown) is formed in the second gate trench 262 if required. The inter layer can be chosen from the material mentioned afore, therefore those details are omitted for simplicity. After forming the inter layer, a second work function metal layer 276 is formed in the first gate trench 260, the second gate trench 262, and the third gate trench 264. It is noteworthy that because the overhang 272 at the opening of the first gate trench 260 is removed, the second work function metal layer 276 is easily formed in the gate trenches 260/262/264. Furthermore, since the U-shaped work function metal 274 is formed in the first gate trench 260, the second work function metal layer 276 is formed along this peculiar profile and obtains an inverted Ω shape or an inverted bell shape. The inverted Ω-shaped second work function metal layer 276 serves as work function metal for n-type transistor and includes titanium aluminide (TiAl), zirconium aluminide (ZrAl), tungsten aluminide (WAl), tantalum aluminide (TaAl), or hafnium aluminide (HfAl). However, those skilled in the art would easily realize that the second work function metal layer 276 is not limited to the abovementioned metals, it can include materials having a work function between about 3.9 eV and about 4.3 eV. Furthermore, the second work function metal layer 276 can be a single-layered or multi-layered structure.

Figure 8:
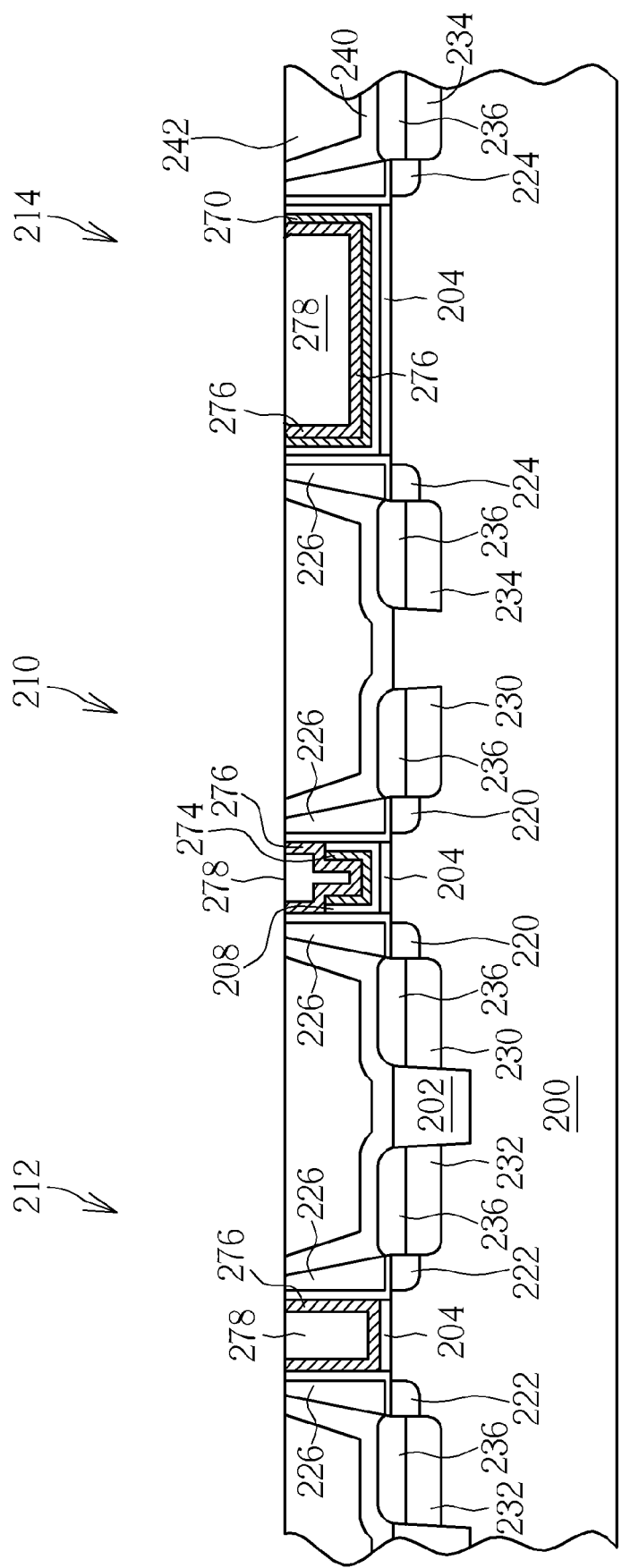

Please still refer to FIG. 7 and FIG. 8. After forming the second work function metal layer 276, a filling metal layer 278 filling the first gate trench 260, the second gate trench 262 and the third gate trench 264 is formed on the substrate 200. The filling metal layer 278 is a single-layered or multi-layered metal layer having superior gap-filling characteristic. The filling metal layer 278 is selected from the group consisting of aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), Ti/W, or Ti/TiN. As shown in FIG. 8, after forming the filling metal layer 278, a planarization process is performed to remove the unnecessary filling metal layer 278, second work function metal layer 276, first work function metal layer 270, and inter layer 208 on the ILD layer 242. Accordingly, a substantially even surface is formed and a semiconductor device having metal gate is obtained. It is observed that the surface of the ILD layer 242 and the top of the filling metal layer 278 are co-planar after planarization process. In addition, since the planarization process is well-known to those skilled in the art, the details are omitted herein in the interest of brevity.

In the first preferred embodiment, the U-shaped work function metal layer 274 is used to provide work function required for p-type metal gate. Therefore, the second work function metal layer 276 and the filling metal layer 278 serves as a multi-layered filling structure for the first transistor 210. It is noteworthy that due to the peculiar profile of the U-shaped work function metal layer 274, the upper opening of the first gate trench 260 is remained imperviously even after forming the U-shaped work function metal layer 274, and an aspect ratio of the first gate trench 260 is consequently reduced. Accordingly, the second work function metal layer 276 and the filling metal layer 278 are able to fill the first gate trench 260 successfully without any seam left, and the reliability of the first transistor 210 is improved. More important, since the etching back process used to etch back the first work function metal layer 270 simultaneously removes the patterned hard mask 250 covering the second transistor 212 according to the preferred embodiment, it economizes steps of forming another the patterned photoresist for protecting the first transistor 210 when removing the patterned hard mask 250 in prior art. Consequently, the preferred embodiment economizes process steps, costs, and effectively prevents problem such as photoresist residues.

Furthermore, It is well-known that there are devices of different line widths, which from smaller than 30 nm to larger than 5 μm, formed on a single wafer, the patterned photoresist 282 is formed on the sacrificial masking layer 280 around devices having line width larger than 0.15 μm for preventing those devices from over etching due to micro loading effect as shown in FIG. 3 and FIG. 4 according to the preferred embodiment. Additionally, it is not limited to perform the etching back process directly after forming the sacrificial masking layer 280 without forming the patterned photoresist 282 in the case that there is no device having line width larger than 0.15 μm in the preferred embodiment.

Figure 9:
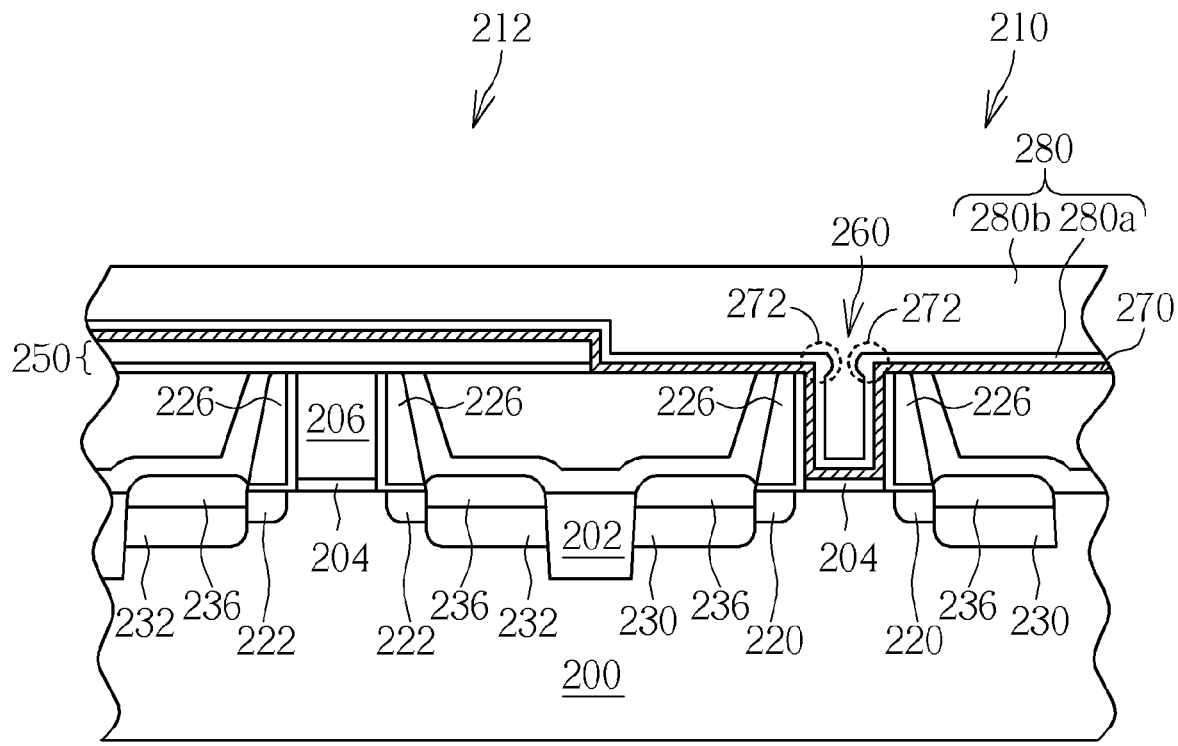
FIGS. 9-12 are schematic drawings illustrating a method of manufacturing a semiconductor device having metal gate provided by a second preferred embodiment of the present invention.

Please refer to FIGS. 9-12, which are schematic drawings illustrating a method of manufacturing a semiconductor device having metal gate provided by a second preferred embodiment of the present invention. It is noteworthy that in the second preferred embodiment, material choice of the elements and steps for forming the elements that are the same with the first preferred embodiment are omitted for the sake of simplicity, and the same elements in both the first and second preferred embodiments are designated by the same numerals. Furthermore, only the first transistor 210 and the second transistor 212 are shown in FIG. 9 for illustrating circumstance when the devices on the wafer are all having line widths smaller than 0.15 μm. However, those skilled in the art would easily realize the steps in the case that there are devices having line widths larger than 0.15 μm, such as the third transistor 214, according to the first preferred embodiment.

Please refer to FIG. 9. Different from the first preferred embodiment, after forming the first work function metal layer 270 in the first gate trench 260, the second preferred embodiment further provides a polysilicon layer 280a and a layer 280b that is formed by spin-on coating on the substrate 200 sequentially. The layer 280b includes a BARC layer, a Si-rich layer with SHB lower than 43%, a SOG layer, a SLAM layer, or an oxide-rich layer such as DUO™ (manufacturing by Honeywell Electronic Materials), but not limited to this. As mentioned above, the first work function metal layer 270 can be a single-layered or multi-layered structure and includes materials having a work function between about 4.8 eV and about 5.2 eV. As shown in FIG. 9, an overhang 272 reducing the opening width of the first gate trench 260 is always formed at the opening of the first gate trench 260 when forming the first work function metal layer 270. As mentioned above, an inter layer (not shown) can be formed before forming the first work function metal layer 270 if required. The polysilicon layer 280a and the layer 280b respectively serving as the first masking layer and the second masking layer construct a multi-layered sacrificial masking layer 280. In other words, the sacrificial masking layer 280 provided by the preferred embodiment is a multi-layered structure.

It is noteworthy that in consideration of impact to the first work function metal layer 270 from the high temperature for forming the polysilicon layer 280a, it is preferable to form the polysilicon layer 280a by low-temperature process. For example, the polysilicon layer 280a can be formed by a physical vapor deposition (PVD). And a thickness of the polysilicon layer 280a is not larger than 150 angstroms (Å). The polysilicon layer 280a is formed to protect the first work function metal layer 270 from oxidation in the Q-time that is a period since a wafer has been waited to be processed such as the period between forming the first work function metal layer 270 and the layer 280b. Furthermore, when rework for the layer 280b is required due to defects in the spin-on coating process or the patterning process, the polysilicon layer 280a also protects the first work function metal layer 270 when removing the defective layer 280b.

Figure 10:
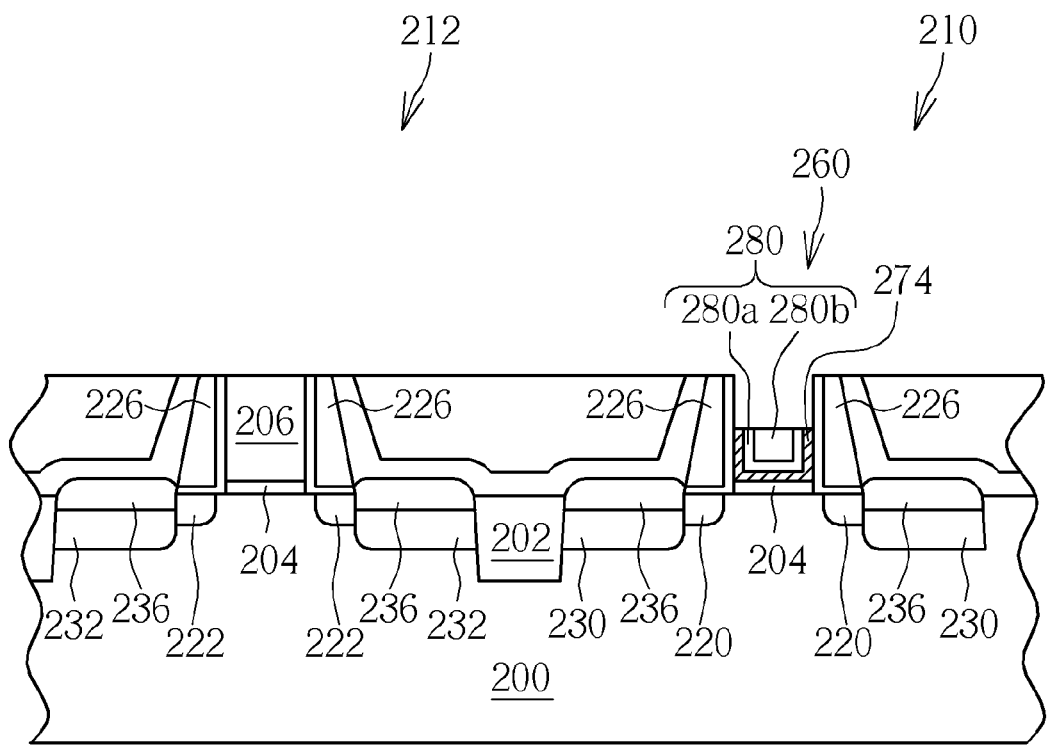
Figure 11:
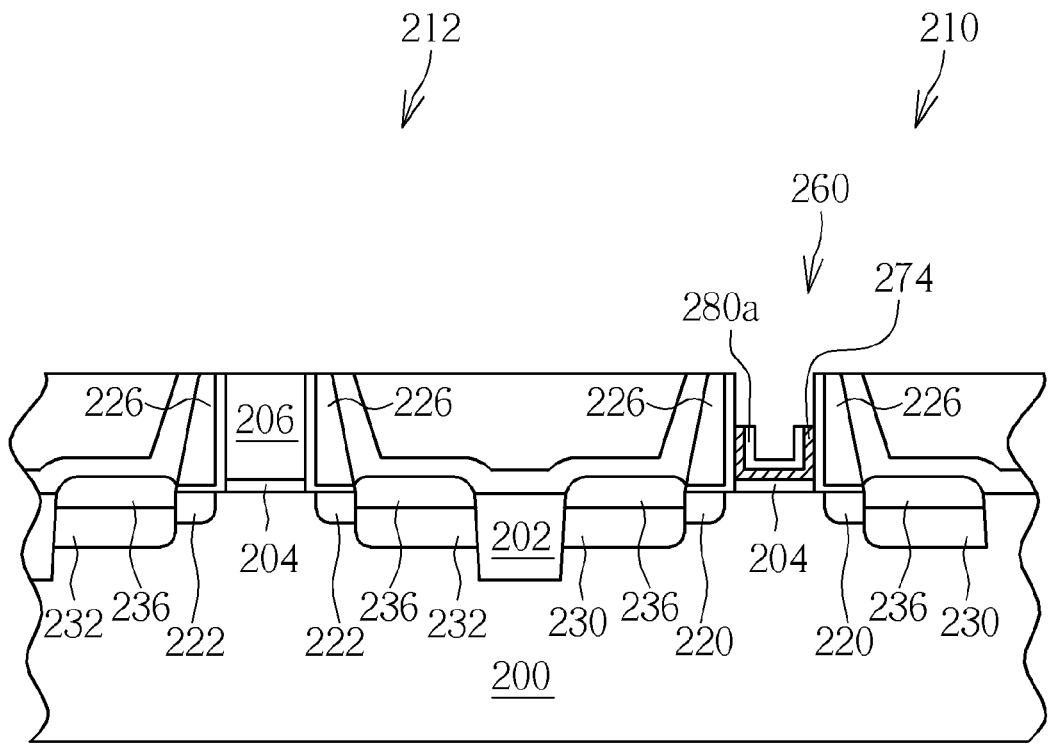

Please refer to FIG. 10. Next, an etching back process is performed to remove a portion of the sacrificial masking layer 280 in the first gate trench 260 and on the substrate 200 with proper etchant such as CO, $O_2$ plasma, or preferably CO and HBr. It is observed that when the $O_2$ plasma undesirably touches the first work function metal layer 270 during etching back the sacrificial masking layer 280, oxidation is happened to the first work function metal layer 270 and performance drift is resulted. However, since the polysilicon layer 280a renders protection to the first work function metal layer 270 in the preferred embodiment, the $O_2$ plasma is obstructed from the first work function metal layer 270. After the etching back process, a surface of the sacrificial masking layer 280 is lower than the opening of the first gate trench 260 that is lower than the surface of the ILD layer 242. Accordingly, a portion of the first work function metal layer 270 in the first gate trench 260 and on the substrate 200 is exposed.

Please still refer to FIG. 10. Then, another etching back process is performed to remove the exposed first work function metal layer 270 with proper etchant. In other words, the etching back process is performed to remove the first work function metal layer 270 exposed in the first gate trench 260 and on the substrate 200; the etching back process also removes the patterned hard mask 250 on the second transistor 212. More important, the etching back process simultaneously removes the overhang 272 of the first work function metal layer 270 formed at the opening of the first gate trench 260. Thus the opening width of the first gate trench 260 previously reduced by the overhang 272 is widened to an original opening width. After the etching back process, an U-shaped work function metal layer 274 that is covered and protected by the sacrificial masking layer 280 is formed in the first gate trench 260, and the dummy gate 206 of the second transistor 212 is exposed.

Additionally, in accordance with a modification to the preferred embodiment, after forming the first work function metal layer 270 on the substrate 200, a portion of the first work function metal layer 270 formed on the second transistor 212 is particularly removed. Furthermore, the patterned hard mask 250 can be removed subsequently after removing the first work function metal layer 270 on the second transistor 212. Then, the multi-layered sacrificial masking layer 280 is formed on the substrate 200 and followed by performing the etch back process, thus the surface of the sacrificial masking layer 280 is lower than the opening of the first gate trench 260. As mentioned above, then another etching back process is performed to remove the exposed first work function metal layer 270 to form the U-shaped work function metal layer 274 in the first gate trench 260 as shown in FIG. 10, Please refer to FIG. 11. Next, a proper etchant is used to remove the layer 280b of the sacrificial masking layer 280. For example, CO or O2 plasma can be used. Since the polysilicon layer 208a protects the first work function metal layer 270 from the O2 plasma, oxidation of the first work function metal layer 270 is further prevented. As mentioned above, the etching back process used to etch back the sacrificial masking layer 280, the etching back process used to remove the overhang 272, the patterned hard mask 250 and the portion of the first work function metal layer 270, and the removal of the layer 280b of the sacrificial masking layer 280 can be in-situ performed.

Figure 12:
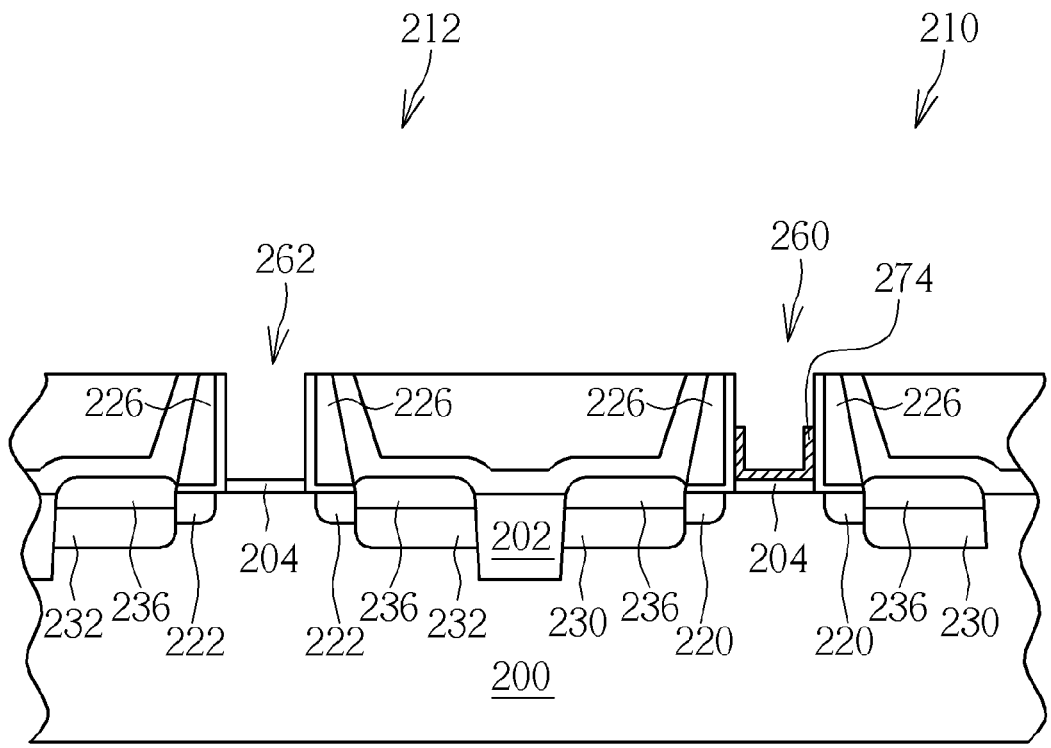

Please refer to FIG. 12. After removing the layer 280b of the sacrificial masking layer 280, another etching process is performed to remove the dummy gate 206 of the second transistor 212 to form a second gate trench 262 in the second transistor 212 as shown in FIG. 12. Since the dummy gate 206 includes polysilicon, the removal of the dummy gate 206 simultaneously removes the polysilicon layer 280a from the first gate trench 260. As mentioned above, an opening width of the second gate trench 262 is the same with the opening width of the first gate trench 260. After the etching process used to form the second gate trench 262, the gate dielectric layer 204 is exposed in a bottom of the second gate trench 262. Subsequently, steps of forming a high-K dielectric layer, selectively forming an inter layer, forming a second work function metal layer, forming a filling metal layer, and a planarization process are performed as mentioned above, and thus omitted for simplicity.

According to the method of manufacturing a semiconductor device having metal gate provided by the second preferred embodiment, the sacrificial masking layer 280 including the polysilicon layer 280a is provided, and the polysilicon layer 280a protects the first work function metal layer 270 in the Q-time or rework processes. Furthermore, the polysilicon layer 280a protects the first work function metal layer 270 from oxidation in the etching back processes, and thus the etching back process for etching the sacrificial masking layer 280 is improved.

Please refer to FIGS. 13-17, which are schematic drawings illustrating a method of manufacturing a semiconductor device having metal gate provided by a third preferred embodiment of the present invention. It is noteworthy that in the third preferred embodiment, material choice of the elements and steps for forming the elements that are the same with the first preferred embodiment are omitted for the sake of simplicity. Furthermore, though FIGS. 13-17 depict only the circumstance when the devices on the wafer are all having line widths smaller than 0.15 µm, those skilled in the art would easily realize the steps in the case that there are devices having line widths larger than 0.15 µm according to the first preferred embodiment.

Figure 13:
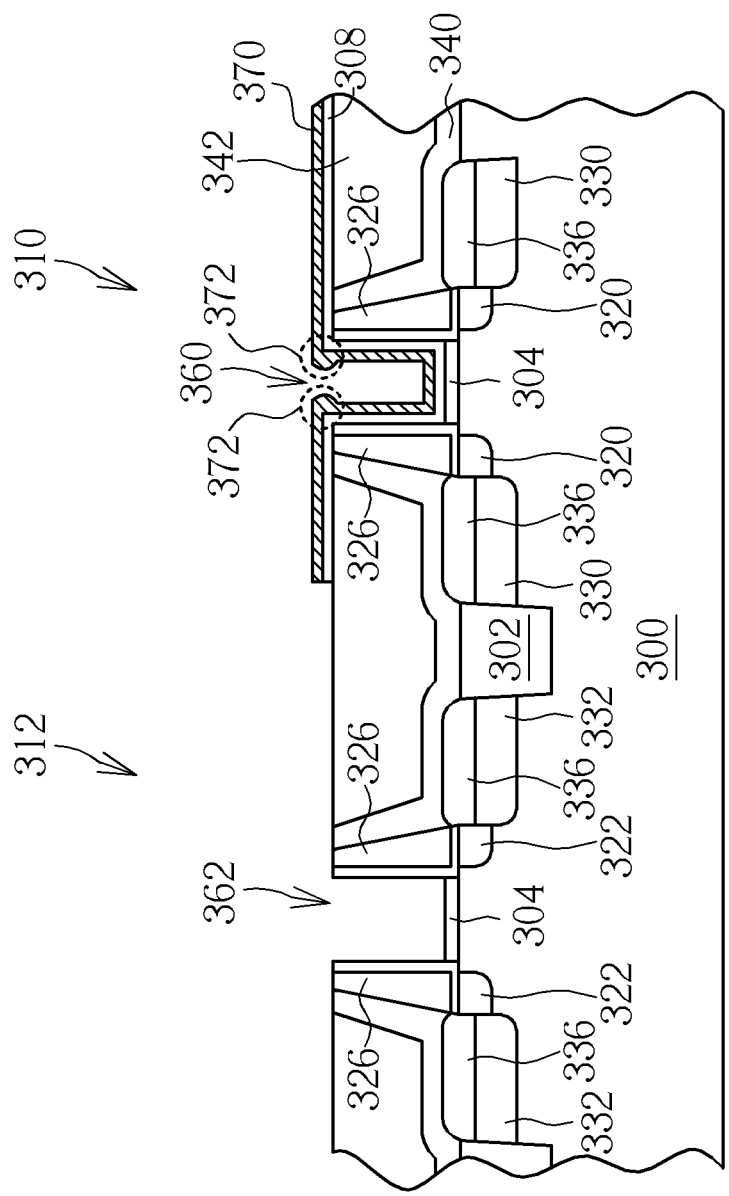
FIGS. 13-17, which are schematic drawings illustrating a method of manufacturing a semiconductor device having metal gate provided by a third preferred embodiment of the present invention.

As shown in FIG. 13, a substrate 300 is provided with a plurality of STI 302 for providing electrical isolation. A first transistor 310 and a second transistor 312 are formed on the substrate 300. The first transistor 310 includes a first conductivity type and the second transistor 312 includes a second conductivity type. The first conductivity type and the second conductivity type are complementary. The first transistor 210 and the second transistor 212 having the complementary conductivity types are electrically isolated from each other by the STI 302. In the preferred embodiment, the first conductivity type is the p-type and the second conductivity type is the n-type. However, those skilled in the art would easily realize that it is not limited to have the first conductivity type being the n-type and the second conductivity type is the p-type.

Please refer to FIG. 13. The first transistor 310 and the second transistor 312 respectively include a gate dielectric layer 304 and a dummy gate (not shown) such as a polysilicon layer. The gate dielectric layer 304 can be a conventional SiO layer or a high-K gate dielectric layer. The first transistor 310 and the second transistor 312 respectively include a first LDD 320 and a second LDD 322, a spacer 326, a first source/drain 330 and a second source/drain 332, and salicides 336 formed on the first source/drain 330 and the second source/drain 332. After forming the first transistor 310 and the second transistor 312, a CESL 340 and an ILD layer 342 are sequentially formed on the substrate 300. Additionally, SEG method can be utilized to form the first source/drain 330 and the second source/drain 332 in the preferred embodiment. Since the steps and materials choices for the abovementioned elements are well known to those skilled in the art, those details are omitted herein in the interest of brevity.

Please still refer to FIG. 13. After forming the CESL 340 and the ILD layer 342, a planarization process is performed to remove a portion of the CESL 340 and the ILD layer 342 to expose the dummy gates of the first transistor 310 and the second transistor 312. Then, a proper etching process is performed to remove the dummy gates of the first transistor 310 and the second transistor 312 to form a first gate trench 360 in the first transistor 310 and a second gate trench 362 in the second transistor 312, respectively. After the etching process, the gate dielectric layer 304 is exposed in the bottom of the first gate trench 360 and the second gate trench 362. As mentioned above, the high-K first process can be integrated into the preferred embodiment, and the gate dielectric layer 304 includes a high-K gate dielectric layer. The high-K materials used to form the gate dielectric layer 304 is the same with those disclosed in the first preferred embodiment, and therefore omitted for simplicity. Additionally, when the high-K last process is integrated into the prefer embodiment, and the gate dielectric layer 304 first includes a conventional SiO layer. In the high-K last process, the gate dielectric layer 304 exposed in the bottom of the first gate trench 360 and the second gate trench 362 are removed and followed by forming a high-K gate dielectric layer (not shown).

Please still refer to FIG. 13. Then, a first work function metal layer 370 is formed on the substrate 300. As mentioned above, an inter layer 308 is selectively formed in the first gate trench 360 and the second gate trench 362 if required. The inter layer 308 includes a barrier layer, a strained stress layer, a tuning metal layer, or the combination thereof, but not limited to this. After forming the first work function metal layer 370, a patterning process is performed to remove the first work function metal layer 370 from the second gate trench 362. Accordingly, the first work function metal layer 370 remains in the first gate trench 360. It is noteworthy that an overhang as depicted in Circle 372 is always formed at the openings of the first gate trench 360 when forming the first work function metal layer 370. It is conspicuous the opening width of the first gate trench 360 is smaller, therefore the overhang 372 renders more serious impact to the opening width of the first gate trench 360. As shown in FIG. 13, the overhang 372 of the first work function metal layer 370 reduces the opening width of the first gate trench 360. The first work function metal layer 370 serves as work function metal for p-type transistor and includes materials having a work function between about 4.8 eV and about 5.2 eV as disclosed in the first preferred embodiment. Additionally, the first work function metal layer 370 can be a single-layered or multi-layered structure. The first work function metal layer 270 can be a single-layered or multi-layered structure and includes materials having a work function between about 4.8 eV and about 5.2 eV.

Figure 14:
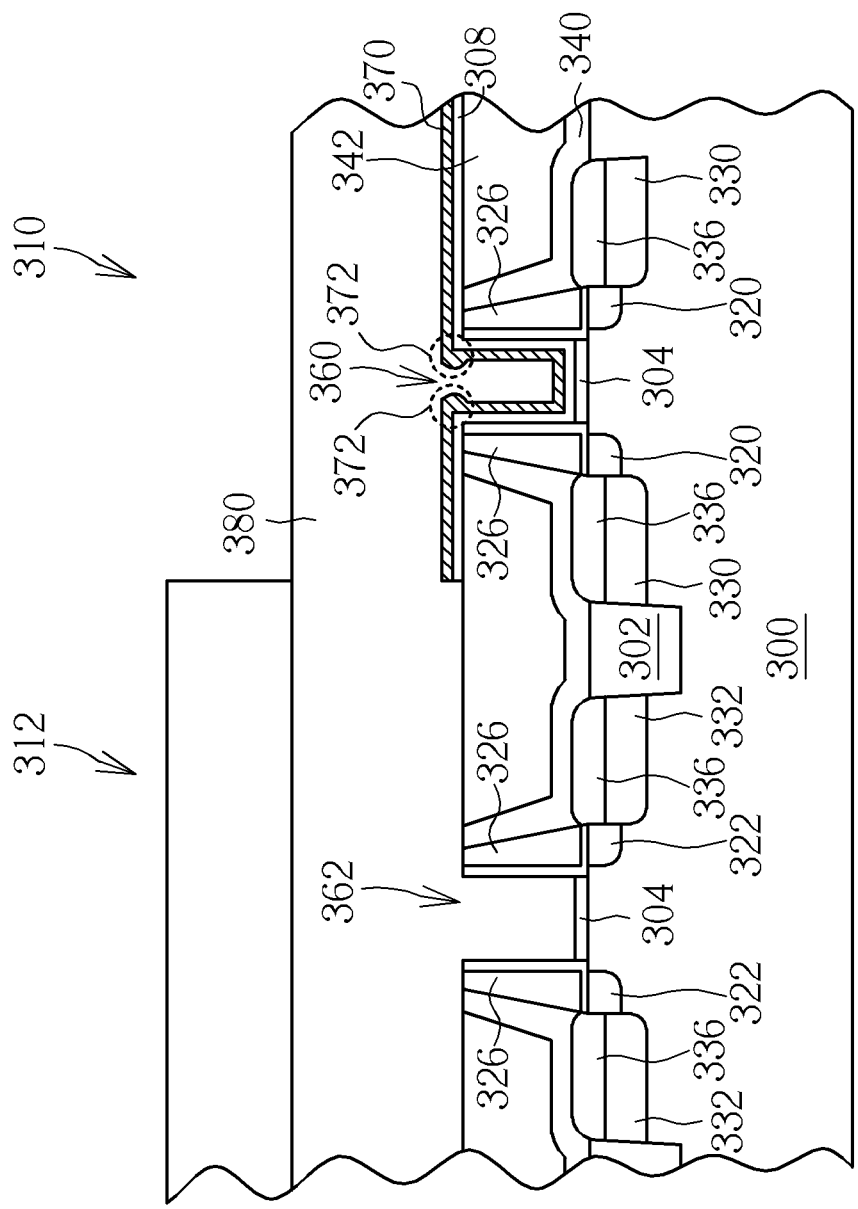

Please refer to FIG. 14. After forming the first work function metal layer 370, a sacrificial masking layer 380 is formed on the substrate 300. The sacrificial masking layer 380 is a layer have superior gap-filling characteristic such as a BARC layer, a polysilicon layer, a Si-rich layer with SHB lower than 43%, a SOG layer, a SLAM layer, or an oxide-rich layer such as DUO™ (manufacturing by Honeywell Electronic Materials), but not limited to this. As mentioned above, though the sacrificial masking layer 380 is a single-layered structure as shown in FIG. 14, the sacrificial masking layer 380 can be a multi-layered structure. As shown in FIG. 14, the sacrificial masking layer 380 is also formed in the first gate trench 360 and the second gate trench 362. After forming the sacrificial masking layer 380, a patterned photoresist 382 is formed on the substrate 300. The patterned photoresist 382 exposes the first transistor 310, particularly exposes the sacrificial masking layer 380 in the first gate trench 360.

Figure 15:
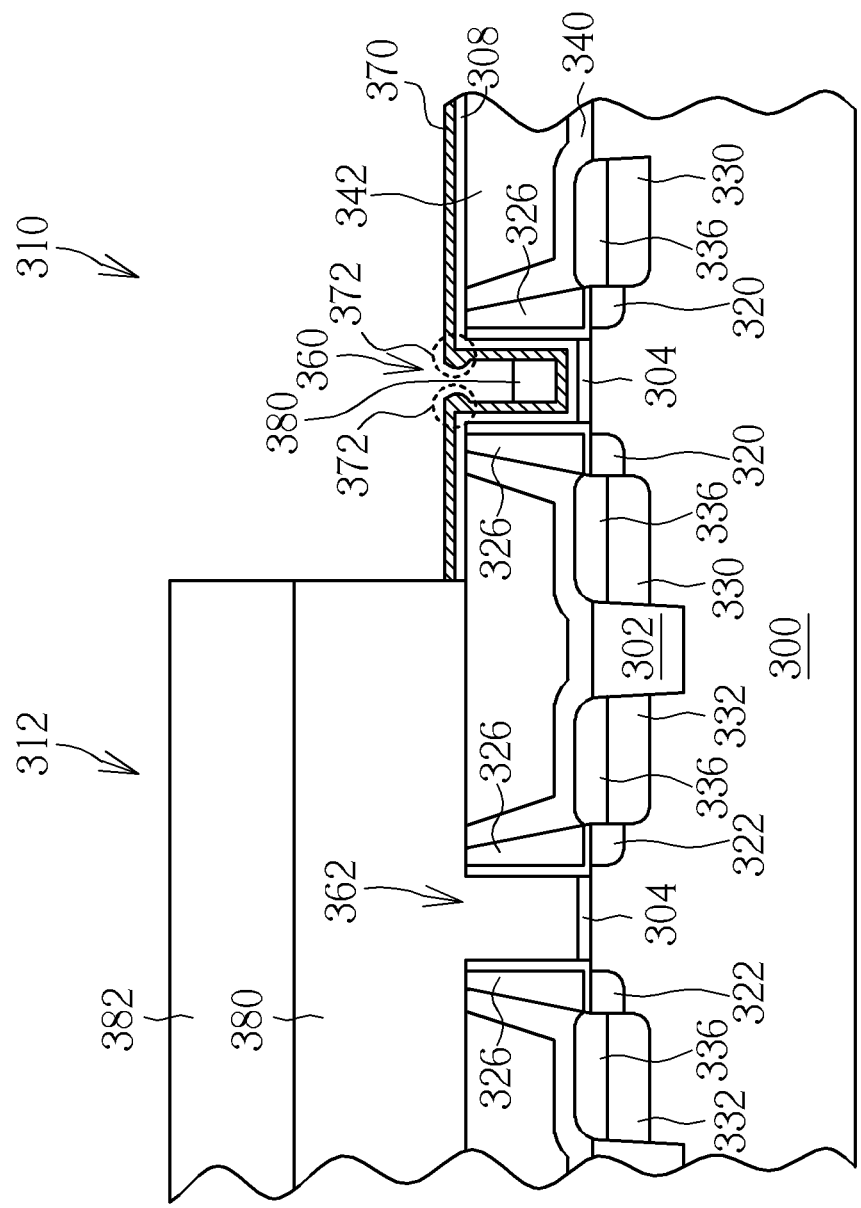

Please refer to FIG. 15. Next, an etching back process is performed to remove the exposed sacrificial masking layer 380 to not filling the first gate trench 360 with a proper etchant. After the etching back process, a surface of the sacrificial masking layer 380 is lower than the opening of the first gate trench 360, that is, lower than a surface of the ILD layer 342. Thus, a portion of the first work function metal layer 370 on the substrate 300 and in the first gate trench 360 is exposed. During the etching back process, the sacrificial masking layer 380 in the second gate trench 362 is protected by the patterned photoresist 382, therefore it remains impervious to the etchant. In other words, the sacrificial masking layer 380 still renders protection to the gate dielectric layer 304 in the second gate trench 362.

Figure 16:
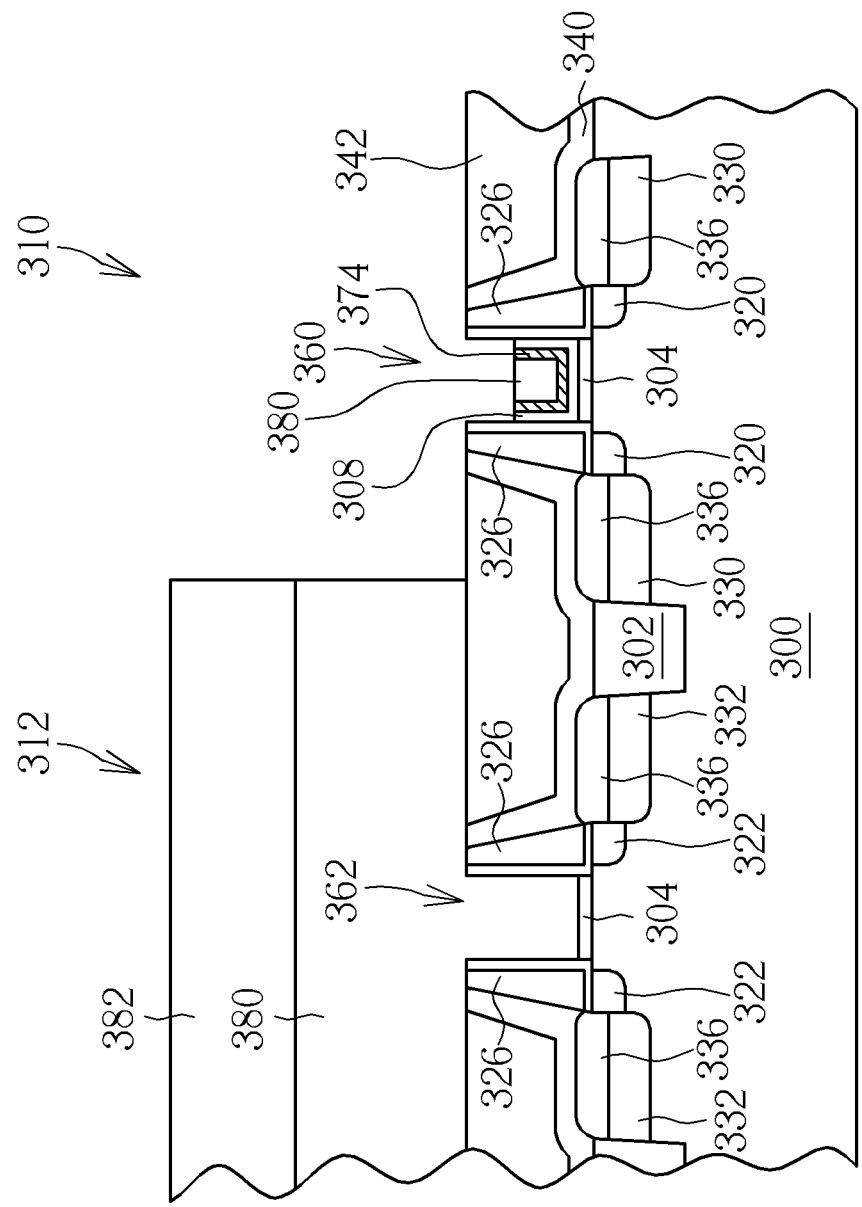

Please refer to FIG. 16. Then, another etching back process is performed to remove the first work function metal layer 370 and the inter layer 308 not covered by the sacrificial masking layer 380 with proper etchant. More important, the etching back process simultaneously removes the overhang 372 of the first work function metal layer 370 formed at the opening of the first gate trench 360. Thus the opening width of the first gate trench 360 previously reduced by the overhang 372 is widened to an original opening width. After the etching back process, an U-shaped work function metal layer 374 that is covered and protected by the sacrificial masking layer 380 is formed in the first gate trench 360.

Figure 17:
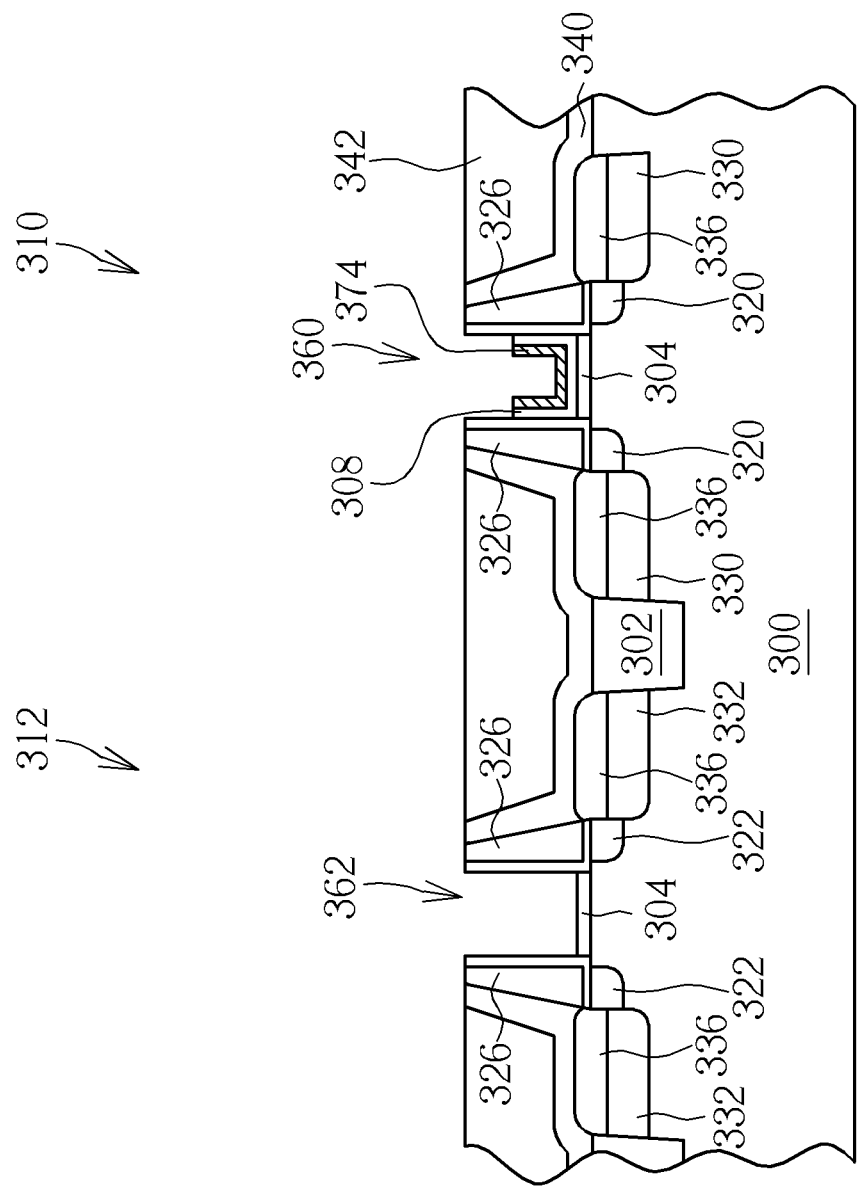

Please refer to FIG. 17. Next, a proper etchant, such as etchant includes $O_2$, $H_2$, and N, is used to remove the patterned photoresist 382 and the sacrificial masking layer 380. It is noteworthy that the etching back process used to etch back the sacrificial masking layer 380, the etching back process used to remove the overhang 372 and the portion of the first work function metal layer 370, and the removal of the sacrificial masking layer 380 can be in-situ performed. After removing the patterned photoresist 382 and the sacrificial masking layer 380, the U-shaped work function metal layer 374 is exposed in the bottom of the first gate trench 360 and the gate dielectric layer 304 is exposed in the bottom of the second gate trench 362. Then steps of forming a high-K gate dielectric layer (if the high-K last process is integrated), selectively forming an inter layer, forming a second work function metal layer, forming a filling metal layer and planarization process are sequentially performed as mentioned in the first preferred embodiment and thus the details are omitted for simplicity.

In the preferred embodiment, the upper opening of the first gate trench 360 is remained imperviously even after forming the U-shaped metal layer 374 due to the peculiar profile of the U-shaped work function metal layer 374. Accordingly an aspect ratio of the first gate trench 360 is reduced, and the second work function metal layer and the filling metal layer are able to fill the first gate trench 360 successfully without any seam left, and the reliability of the first transistor 310 is improved.

Furthermore, It is well-known that there are devices of different line widths, which from smaller than 30 nm to larger than 5 µm, formed on a single wafer, the patterned photoresist 382 therefore can be formed on the sacrificial masking layer 380 around devices having line width larger than 0.15 µm for preventing those devices from over etching due to micro loading effect and formed on around devices having conductivity type opposite to that of the first transistor 310 for protecting those devices from etching in the preferred embodiment. Accordingly, though there are lots of transistor devices of different conductivity types and of different line widths, the U-shaped work function metal layer 374 is formed in the desired gate trench without impacting the abovementioned areas according to the preferred embodiment.

Figure 18:
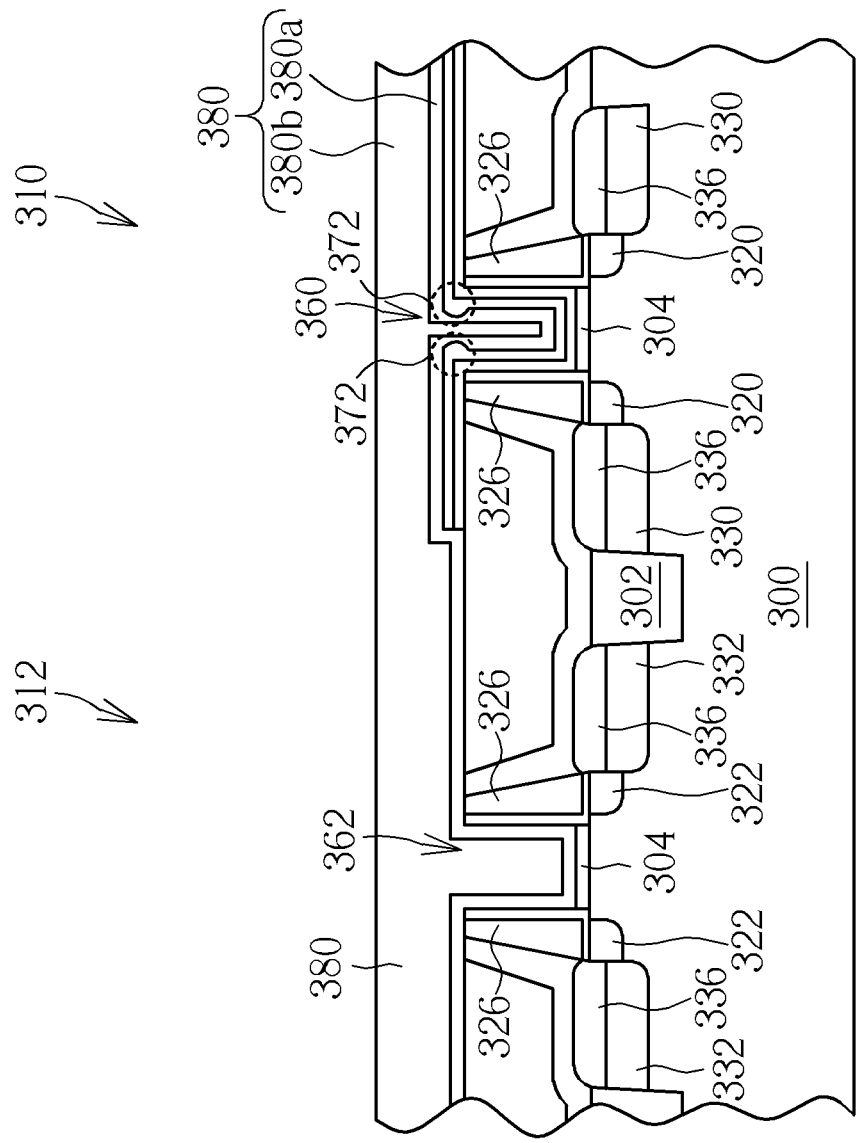
FIG. 18 is a drawing illustrating a modification to the third preferred embodiment.

Please refer to FIG. 18, which is a drawing illustrating a modification to the third preferred embodiment. It is noteworthy that the sacrificial masking layer 380 can be a single-layered structure as shown in FIGS. 14-16. The sacrificial masking layer 380 also can be a multi-layered structure as shown in FIG. 18. That is, after forming the first work function metal layer 370 in the first gate trench 360, a polysilicon layer 380a is formed on the substrate 300 and followed by forming a layer 380b by spin-on coating according to the modification. The layer 380b includes a BARC layer, a Si-rich layer with SHB lower than 43%, a SOG layer, a SLAM layer, or an oxide-rich layer such as DUO™ (manufacturing by Honeywell Electronic Materials), but not limited to this. The polysilicon layer 380a and the layer 380b respectively serving as the first masking layer and the second masking layer construct a multi-layered sacrificial masking layer 380.

As mentioned above, it is noteworthy that in consideration of impact to the first work function metal layer 370 from the high temperature for forming the polysilicon layer 380a, it is preferable to form the polysilicon layer 380a by low-temperature process such as the PVD. A thickness of the polysilicon layer 380a is not larger than 150 Å. The polysilicon layer 380a is formed to protect the first work function metal layer 370 from oxidation in the Q-time that is a period since a wafer has been waited to be processed such as the period between forming the first work function metal layer 370 and the layer 380b. Furthermore, when rework for the layer 380b is required due to defects in the spin-on coating process or the patterning process, the polysilicon layer 380a also protects the first work function metal layer 370 when removing the defective layer 308b.

According to the modification, the sacrificial masking layer 380 including the polysilicon layer 380a is provided, and polysilicon layer 380a protects the first work function metal layer 370 in the Q-time or rework processes. Furthermore, the polysilicon layer 380a protects the first work function metal layer 370 in the etching back processes, and thus the etching back process for etching the sacrificial masking layer 380 is improved.

According to the method of manufacturing a semiconductor device having metal gate provided by the present invention, the sacrificial masking layer not filling the first gate trench is formed to protect a portion of the first work function metal layer in the first gate trench. Therefore the unnecessary first work function metal layer on the substrate and the overhang at the opening of the first gate trench are removed. Consequently, layers such as the second work function metal layer and the filling metal layer are formed successfully formed in the first gate trench without any seam. Therefore the semiconductor device having metal gate provided by the present invention has the advantage of improved reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device having metal gate comprising:
   providing a substrate having a first transistor and a second transistor formed thereon, the first transistor having a first gate trench and a first conductivity type, the second transistor having a second conductivity type, and the first conductivity type and the second conductivity type being complementary;
   forming a first work function metal layer only in the first gate trench;
   forming a sacrificial masking layer in the first gate trench;
   removing a portion of the sacrificial masking layer to expose a portion of the first work function metal layer;
   removing the exposed first work function metal layer to form a U-shaped work function metal layer, wherein topmost portions of the U-shaped work function metal layer are lower than an opening of the first gate trench; and
   removing the sacrificial masking layer.

2. The method of manufacturing a semiconductor device having metal gate according to claim 1, wherein the sacrificial masking layer is a multi-layer, and the multi-layer comprises a first masking layer and a second masking layer.

3. The method of manufacturing a semiconductor device having metal gate according to claim 2, further comprising an etching back process for removing the portion of the sacrificial masking layer to not fill the first gate trench.

4. The method of manufacturing a semiconductor device having metal gate according to claim 3, further comprising an etching process performed to remove the first masking layer of the sacrificial masking layer and left the second masking layer.

5. The method of manufacturing a semiconductor device having metal gate according to claim 1, further comprising an etching back process for removing the portion of the sacrificial masking layer to not fill the first gate trench.

6. The method of manufacturing a semiconductor device having metal gate according to claim 1, wherein the second transistor further comprises a second gate trench formed therein, and an opening width of the second gate trench is the same with an opening width of the first gate trench.

7. The method of manufacturing a semiconductor device having metal gate according to claim 6, wherein the second gate trench and the first gate trench are formed simultaneously, and the second gate trench is filled with the sacrificial masking layer.

8. The method of manufacturing a semiconductor device having metal gate according to claim 7, further comprising forming a first patterned photoresist exposing the sacrificial masking layer in the first gate trench on the sacrificial masking layer before removing the portion of the sacrificial masking layer.

9. The method of manufacturing a semiconductor device having metal gate according to claim 6, further comprising:
   forming a patterned hard mask on the substrate for covering and protecting the second transistor during forming the first gate trench;
   removing the exposed first work function metal layer and the patterned hard mask simultaneously; and
   forming the second gate trench in the second transistor.

10. The method of manufacturing a semiconductor device having metal gate according to claim 9, wherein the first work function metal layer further comprises an overhang, and the overhang is simultaneously removed with removing the exposed first work function metal layer and the patterned hard mask.

11. The method of manufacturing a semiconductor device having metal gate according to claim 6, further comprising sequentially forming a second work function metal layer and a filling metal layer in the first gate trench and the second gate trench.

12. The method of manufacturing a semiconductor device having metal gate according to claim 11, wherein an upper area of the second work function metal layer in the first gate trench is wider than a lower area of the second work function metal layer.

13. The method of manufacturing a semiconductor device having metal gate according to claim 1, further comprises a third transistor formed on the substrate, and a third gate trench is formed in the third transistor simultaneously with forming the first gate trench, wherein an opening width of the third gate trench is larger than an opening width of the first gate trench.

14. The method of manufacturing a semiconductor device having metal gate according to claim 13, further comprises steps performed before removing the portion of the sacrificial masking layer to expose the portion of the first work function metal layer:
   forming the sacrificial masking layer in the third gate trench; and
   forming a second patterned photoresist on the substrate, the second patterned photoresist covering the third transistor but exposing the first transistor.

15. A method of manufacturing a semiconductor device having metal gate comprising:

providing a substrate having a first transistor and a second transistor formed thereon, the first transistor having a first gate trench formed therein, the second transistor having a second gate trench formed therein, and an opening width of the second gate trench is larger than an opening width of the first gate trench;

forming a first work function metal layer in the first gate trench;

forming a sacrificial masking layer in the first gate trench and the second gate trench;

forming a patterned photoresist covering the second transistor and exposing the sacrificial masking layer in the first gate trench on the substrate;

removing a portion of the sacrificial masking layer to expose a portion of the first work function metal layer; and removing the exposed the first work function metal layer to form a U-shaped work function metal layer.

16. The method of manufacturing a semiconductor device having metal gate according to claim 15, wherein the sacrificial masking layer is a multi-layer, and the multi-layer comprises a first masking and a second masking layer.

17. The method of manufacturing a semiconductor device having metal gate according to claim 16, further comprising an etching back process for removing the portion of the sacrificial masking layer to not fill the first gate trench.

18. The method of manufacturing a semiconductor device having metal gate according to claim 17, further comprising an etching process performed to remove the first masking layer of the sacrificial masking layer and left the second masking layer.

19. The method of manufacturing a semiconductor device having metal gate according to claim 15, further comprising an etching back process for removing the portion of the sacrificial masking layer.

20. The method of manufacturing a semiconductor device having metal gate according to claim 15, further comprising removing the sacrificial masking layer after forming the U-shaped work function metal layer.

21. The method of manufacturing a semiconductor device having metal gate according to claim 15, further comprising a third transistor positioned on the substrate, the first transistor and the second transistor comprise a first conductivity type, the third transistor comprises a second conductivity type, and the first conductivity type and the second conductivity type complementary.

22. The method of manufacturing a semiconductor device having metal gate according to claim 21, wherein the third transistor further comprises a third gate trench formed simultaneously with forming the first gate trench and the second gate trench.

23. The method of manufacturing a semiconductor device having metal gate according to claim 22, wherein an opening width of the third gate trench is the same with the opening width of the first gate trench, and the third gate trench is filled with the sacrificial masking layer.

24. The method of manufacturing a semiconductor device having metal gate according to claim 23, wherein the patterned photoresist covers the sacrificial masking layer in the third gate trench.

25. The method of manufacturing a semiconductor device having metal gate according to claim 22, further comprising sequentially forming a second work function metal layer and a filling metal layer in the first gate trench, in the second gate trench and in the third gate trench.

26. The method of manufacturing a semiconductor device having metal gate according to claim 25, wherein an upper area of the second work function metal layer in the first gate trench is wider than a lower area of the second work function metal layer.

27. The method of manufacturing a semiconductor device having metal gate according to claim 15, wherein the first work function metal layer is simultaneously formed in the second gate trench.

* * * * *